(12) United States Patent
Kim et al.

(10) Patent No.: US 6,819,129 B2
(45) Date of Patent: Nov. 16, 2004

(54) METHOD AND APPARATUS FOR TESTING A NON-STANDARD MEMORY DEVICE UNDER ACTUAL OPERATING CONDITIONS

(75) Inventors: Chang-Nyun Kim, Chungcheongnam-do (KR); Sang-Jun Park, Chungcheongnam-do (KR); Sun-Ju Kim, Chungcheongnam-do (KR); Hyun-Ho Park, Chungcheongnam-do (KR); Jin-Seop Seo, Chungcheongnam-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 15 days.

(21) Appl. No.: 10/314,474

(22) Filed: Dec. 5, 2002

(65) Prior Publication Data

US 2003/0080762 A1 May 1, 2003

Related U.S. Application Data

(63) Continuation-in-part of application No. 09/733,336, filed on Dec. 8, 2000.

(30) Foreign Application Priority Data

Dec. 28, 2001 (KR) ........................................ 2001-87064

(51) Int. Cl.⁷ ............................................. G01R 31/02
(52) U.S. Cl. ..................................... 324/755; 324/765
(58) Field of Search ................................. 324/754–762, 324/765, 158.1; 361/740, 759, 807, 818; 439/68–70, 377, 638, 842

(56) References Cited

U.S. PATENT DOCUMENTS

| | | | | |
|---|---|---|---|---|
| 4,568,134 A | * | 2/1986 | DiMondi | ..................... 439/64 |
| 5,076,794 A | * | 12/1991 | Ganthier | ..................... 439/70 |
| 5,652,523 A | | 7/1997 | Noguchi | |
| 5,794,175 A | * | 8/1998 | Conner | ..................... 702/119 |
| 6,114,867 A | * | 9/2000 | Terao | ..................... 324/760 |
| 6,437,586 B1 | * | 8/2002 | Robinson | ..................... 324/755 |

FOREIGN PATENT DOCUMENTS

| | | |
|---|---|---|
| JP | 10-260220 | 9/1998 |
| KR | 2000-49650 | 8/2000 |
| KR | 2020000017256 | 9/2000 |
| KR | 2001-96955 | 11/2001 |

OTHER PUBLICATIONS

English language abstract for Korean Utility Model No. 2020000017256.
English language abstract for Japanese Publication No. 10–260220.
English language of abstract for Korean Patent Publication No. 2000–49650, filed Aug. 5, 2000.
English language of abstract for Korean Patent Publication No. 2001–96955, filed Nov. 8, 2001.

* cited by examiner

*Primary Examiner*—Minh N. Tang
(74) *Attorney, Agent, or Firm*—Marger Johnson & McCollom, P.C.

(57) ABSTRACT

A method and apparatus for testing memory devices under actual operating conditions can accommodate non-standard memory devices through the use of an interface board that adapts a non-standard pin configuration to a standard pin configuration on a test substrate. The interface board can include a first surface on which to mount the non-standard device, a pin matching circuit, and a second surface constructed and arranged to couple the pin matching circuit to a standard pin configuration. The interface board can be mounted directly on the test substrate, or coupled to the test substrate through various arrangements of sockets, connection boards, and supports.

35 Claims, 7 Drawing Sheets

METHOD AND APPARATUS FOR TESTING A NON-STANDARD MEMORY DEVICE UNDER ACTUAL OPERATING CONDITIONS

This application claims priority from Korean patent application No. 2001-87064 filed Dec. 28, 2001 in the name of Samsung Electronics Co., Ltd., which is herein incorporated by reference; this application is a continuation-in-part of U.S. patent application Ser. No. 09/733,336 filed Dec. 8, 2000, incorporated by reference.

BACKGROUND

The present invention relates to test technology for semiconductor devices, and more particularly, to a method and apparatus for testing non-standard memory devices under actual operating conditions.

FIG. 1 illustrates a conventional process for fabricating and testing semiconductor integrated circuit (IC) devices and a printed circuit board onto which the IC devices are assembled. First, numerous semiconductor devices are fabricated in a semiconductor wafer 10. The semiconductor devices are tested at the wafer-level, and faulty devices are selectively marked for disposal during a sorting process. Non-faulty devices are then separated from the wafer.

The individual semiconductor devices that pass the wafer-level test are then assembled into packages. The packaged devices 20 are tested at the package-level by using a burn-in test, which screens out early defects under extreme temperature and electrical conditions, and a functional test, which determines the electrical characteristics of the devices. Good devices that pass the package-level tests are assembled into printed circuit board-type products (such as memory module 30 shown in FIG. 1). The board-type products are also tested after assembly.

A disadvantage of the conventional test process described above is that test conditions do not always correspond to actual operating conditions that the semiconductor devices encounter during actual use. Therefore, even if a packaged device passes the burn-in and the functional tests, there might exist some defects that cannot be detected until the device is assembled into the board-type product. This increases production costs due to the expense associated with repairing and retesting the product or, if repair is not possible, with scrapping the product.

For example, a large number of semiconductor memory devices are assembled into a board-type memory module such as a Single Inline Memory Module (SIMM) or a Dual Inline Memory Module (DIMM). Such memory modules are typically installed onto a system-level board such as the motherboard of a computer system. Even if the module contains only one memory device that does not operate properly after installation, the entire module must be disposed of because it is prohibitively expensive to remove and replace the improperly operating device which is soldered onto the module.

Another drawback of the conventional test process is that conventional test equipment is complicated, bulky and expensive. Manufacturers of semiconductor memory devices typically utilize testers such as the Hewlett Packard model HP83000 tester and the Advan tester to test the packaged devices. These testers generate test signal patterns that simulate memory bus signals (e.g., clock, row address strobe (RAS), column address strobe (CAS), data and address signals) which the memory device will receive from a central processing unit (CPU) or chipset when utilized in the system level board. The test signals are applied to the terminal leads of the memory device under test (DUT), and then the tester analyzes signals received back from the memory device to determine whether the electrical characteristics are acceptable. Although this type of tester is very flexible and therefore capable of a broad range of tests, it cannot provide an environment identical to that encountered during actual operation. Furthermore, to provide this test flexibility, the tester becomes more complicated, and thereby more difficult and more expensive to operate and program.

To provide a more realistic test environment, a board-type product such as a memory module can be tested on a system-level test substrate that provides test conditions that more nearly corresponds to an actual operating environment. For example, the board-type device can be mounted the motherboard of a computer system which is used as a test substrate to test the board-level device under actual operating conditions. In general, such a board-type product complies with relevant international standards such as Joint Electron Device Engineering Council (JEDEC), and the system-level test substrate such as a motherboard of a computer system has a socket for receiving the board-type product.

The test substrate used for the actual test is suitable for JEDEC standard memory modules, but not for non-standard memory modules, that is, custom-made memory modules. For example, when a 200-pin DIMM, which is a custom-made module for a high-performance server, is mounted on a test substrate for a JEDEC standard 168-pin DIMM used in most desktop computers, the memory devices do not operate properly because the operating environment provided by the test substrate is different from the actual operating environment for the 200-pin DIMM.

SUMMARY OF THE INVENTION

One aspect of the present invention is a system for testing a non-standard memory device under actual operating conditions. The system comprises an interface board having a first surface, a second surface, and a pin matching circuit. A socket on the first surface can couple the non-standard memory device to the pin matching circuit, and the second surface is constructed and arranged to couple the pin matching circuit to a standard pin configuration. The second surface of the interface board can be mounted directly on the test substrate. Alternatively, a second socket on the second surface of the interface board can be used to couple the pin matching circuit to the test substrate.

The pin matching circuit can comprise a first matching unit for allowing a one-to-one correspondence between signals of the standard pin configuration and non-standard pin configurations. The pin matching circuit can further comprise a second matching unit to selectively assign signals of the standard pin configuration to signals of the non-standard pin configuration.

Another aspect of the present invention is a method for testing a memory device having a non-standard pin configuration under actual operating conditions comprising. The method comprises coupling the memory device to an interface board that is constructed and arranged to adapt the non-standard pin configuration of the memory device to a standard pin configuration on a test substrate, and operating the test substrate.

A further aspect of the present invention is an interface board for an actual test of a non-standard memory device. The interface board comprises a circuit board including a first surface, a second surface, and a circuit layer. The interface board further comprises a first socket, which is formed on the first surface of the circuit board to receive the non-standard memory device for electrically connecting the memory devices and the circuit layer. The interface board still further comprises a second socket, which is formed on the second surface of the circuit board, to electrically connect the circuit layer and a standard test substrate. In particular, the interface board comprises a pin matching circuit, which is formed in the circuit layer, to match the standard pin configuration of the test substrate to the non-standard pin configuration of the non-standard memory device.

The pin matching circuit may include a first matching unit and a second matching unit. The first matching unit allows a one-to-one correspondence that uniquely assigns each standard input of control signals and address signals of the standard pin configuration to each non-standard output of control signals and address signals of the non-standard pin configuration. The second matching unit allows a sequential and interleaving link that selectively assigns each standard input of data input/output signals of the standard pin configuration to each non-standard output of data input/output signals of the non-standard pin configuration.

The interface board may further comprise a clock inverter circuit, which is formed in the circuit layer to selectively or simultaneously enable two clock signals of the non-standard pin configuration in response to one clock signal of the standard pin configuration.

Another aspect of the present invention is an actual testing system for a non-standard memory device. The actual testing system comprises a standard test substrate including a plurality of components for providing actual test conditions to the non-standard memory device. The actual testing system further comprises an interface board including a circuit board, a first and a second sockets, and a pin matching circuit. The circuit board has a first surface, a second surface, and a circuit layer. The first socket is formed on the first surface of the circuit board to receive the non-standard memory device and electrically connect the memory device and the circuit layer. The second socket is formed on the second surface of the circuit board to electrically connect the circuit layer and a standard test substrate. The pin matching circuit is formed in the circuit layer to match the standard pin configuration of the standard test substrate with the non-standard pin configuration of the non-standard memory device.

In the actual testing system, the interface board may further include a clock inverter circuit, which is formed in the circuit layer, to selectively or simultaneously enable two clock signals of the non-standard pin configuration in response to one clock signal of the standard pin configuration.

The interface board may be mounted on either surface of the standard test substrate, the surface being, or otherwise opposite to, a place where the plurality of components are formed.

DETAILED DESCRIPTION

Some embodiments of the present invention will now be described with reference to the accompanying drawings. The invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
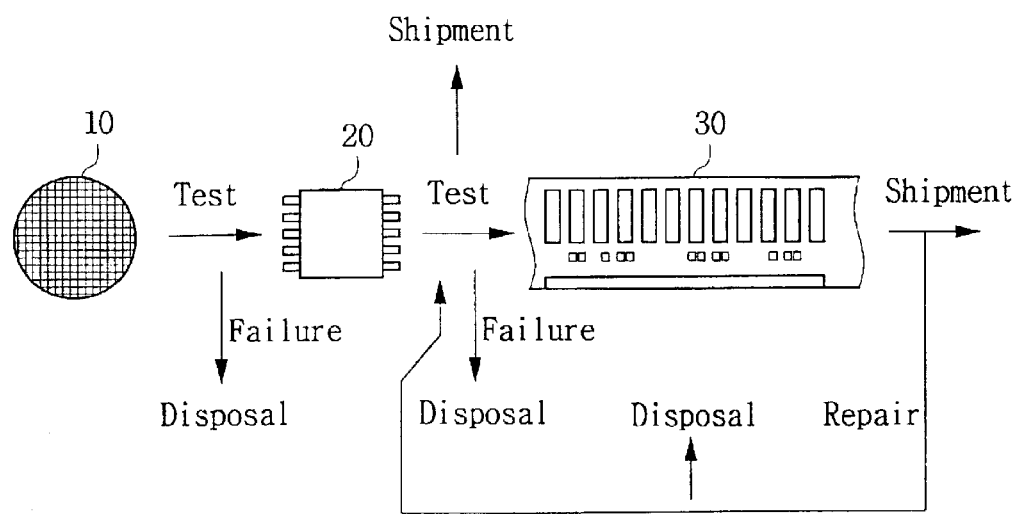
FIG. 1 is a schematic view showing a conventional process for testing semiconductor devices.
Figure 2:
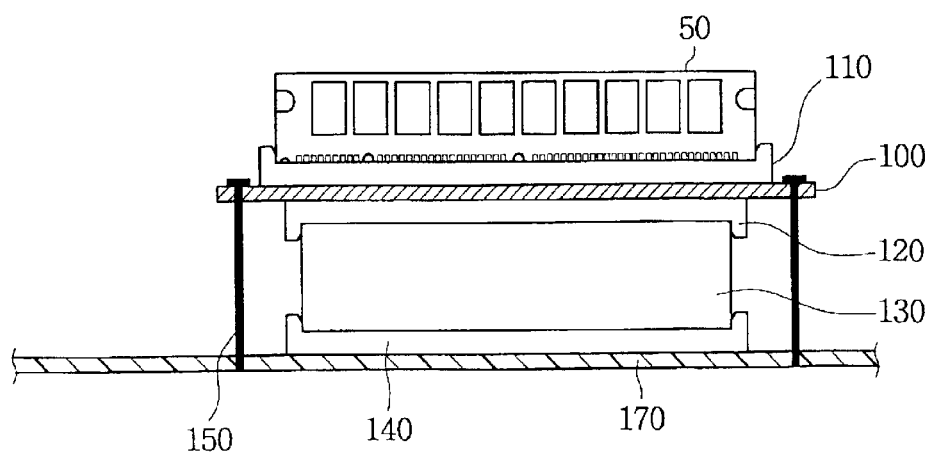
FIG. 2 is a cross-sectional view schematically showing an embodiment of a testing system in accordance with the present invention.

FIG. 2 is a cross-sectional view that schematically illustrates an embodiment of an actual testing system in accordance with the present invention. The system of FIG. 2 includes a semiconductor memory device 50 to be tested, an interface board 100, and a test substrate 170. In a preferred embodiment, the semiconductor device 50 is a board-type product such as a memory module, and the test substrate 170 corresponds to the motherboard of a computer system. Moreover, the semiconductor device 50 is a non-standard or custom-made device, whereas the test substrate 170 is designed to accommodate a standard device. For example, the semiconductor device 50 is a 200-pin DIMM memory module, and the test substrate 170 is the motherboard suitable for a 168-pin DIMM memory module. The interface board 100, a kind of a test substrate, is designed for easy mounting and detaching of the semiconductor device 50.

The interface board 100 is fixed to the test substrate 170 by a support 150. In addition, the interface board 100 is electrically connected to the test substrate 170 via sockets 120 and 140 and a connection board 130. Other components mounted on the test substrate 170 are not depicted in FIG. 2 so as to simplify the drawing for clear illustration of the principles of the present invention.

The system of FIG. 2 can perform a test of semiconductor device 50 under actual operating conditions by mounting the semiconductor device 50 on the interface board 100, electrically connecting the interface board 100 to the test substrate 170, and operating the test substrate 170. FIG. 2 shows a system designed for creating realistic test conditions for a memory device in a computer motherboard; it is, however, merely one example. Other types of semiconductor devices may be tested while mounted on other types of test substrates such as motherboards of servers, communication equipment and exchangers.

Figure 3:
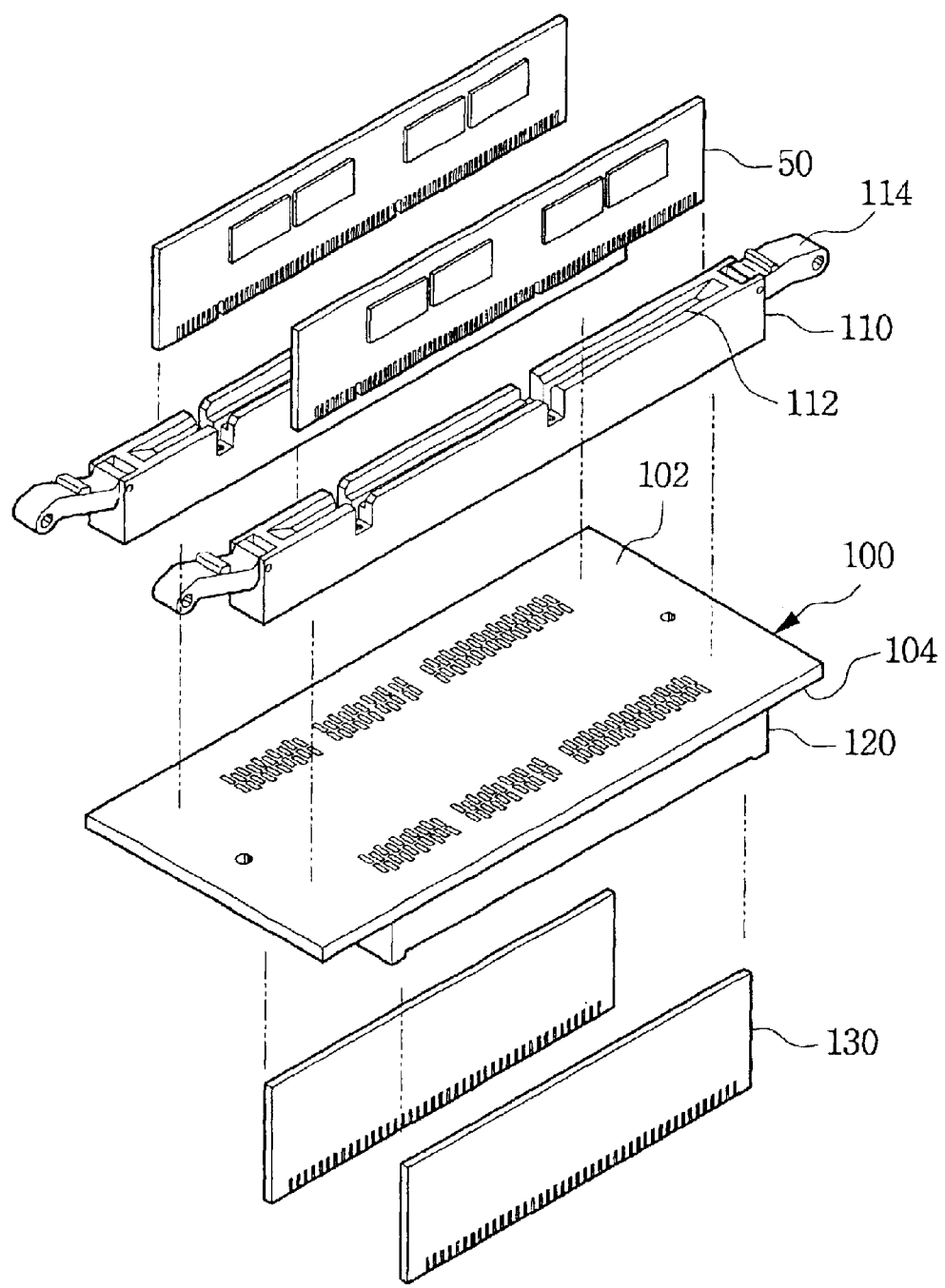
FIG. 3 is an exploded perspective view showing one embodiment of an interface board in accordance with the present invention.

Referring to FIGS. 2 and 3, the interface board 100 includes a circuit board having a circuit layer. First and a second sockets 110 and 120 are formed on first and second surfaces 102 and 104 of the interface board 100, respectively. The second surface 104 faces the test substrate 170. Preferably, the interface board 100 is a multi-layered structure having, for example, a power plane, a ground plane, at least one signal plane, and insulating layers such as glass fiber layers interposed between the planes.

The first socket 110 receives the semiconductor device 50, and the second socket 120 receives the connection board 130. The first socket 110 has a structure adapted for easy mounting and detaching of the semiconductor device 50, and makes an electrical connection between the semiconductor device 50 and the circuit layer of the interface board 100. Similarly, the second socket 120 has a structure adapted for easy mounting and detaching of the connection board 130, and makes an electrical connection between the interface board 100 and the test substrate 170.

Preferably, each of the sockets 110 and 120 has flexible contact-type pins (not shown), which may have a footprint similar to that of a dual inline package (DIP). In addition, the first socket 110 has a groove 112 in which the contact-type pins are formed and into which the semiconductor device 50 can be inserted. Two handles 114 are also provided at the ends of the groove 112, each being joined by a pivot. When the semiconductor device 50 is inserted into the groove 112, the handles 114 are rotated upwardly on the pivot, and the contact-type pins flex to maintain contact with the device 50. Then, by pushing down the handles 114, the device 50 in the groove 112 can be easily detached from the groove 112. This structure of the socket 110 not only permits easy detachment of the device 50, but also increases the expected life span of the socket 110.

The first socket 110 has a pin configuration adapted for a non-standard memory module such as a 200-pin DIMM memory module, whereas the second socket 120 has a pin configuration adapted for a standard memory module such as a 168-pin DIMM memory module. The 168-pin DIMM is what is found in most desktop computers today. At least three memory types, FPM, EDO and SDRAM (Synchronous DRAM), are offered in 168-pin DIMMs. Their configurations include 64-bit, 72-bit and 80-bit wide data paths, with or without ECC (Error Check Code), and they come in 16, 32, 64, 128, 256, 512 and 1,024 megabytes sizes.

In order to test the non-standard memory device 50 under actual operating conditions, the pin configuration of the non-standard memory device 50 should match that of the standard socket, that is, the second socket 120. An embodiment of a pin matching circuit for the interface board 100 will be described below. The interface board 100 preferably includes further components (not shown) that are verified through impedance and signal integrity measurement to create precise test conditions for the device 50 and to eliminate the effect of signal skew or noise. In addition, the interface board 100 is preferably designed to compensate for environmental clearance between a case where the device 50 is directly mounted to the test substrate 170 and a case where the device 50 is connected to the test substrate 170 via the sockets 110 and 120 and the connection board 130. This environmental compensation includes adjusting the timing of clock signals, adjusting the timing margin of control signals, adjusting AC parameters of signals, and adjusting power signals.

Figure 4:
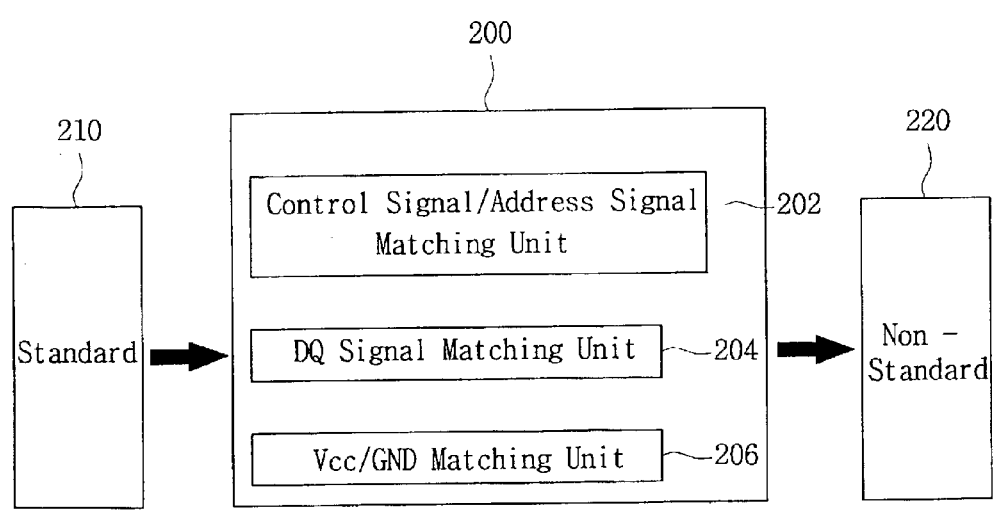
FIG. 4 is a block diagram showing an embodiment of a pin matching circuit of an interface board in accordance with the present invention.

An embodiment of a pin matching circuit according to the present invention is shown in FIG. 4. The pin matching circuit 200, which is provided on the circuit layer of the interface board described above, adapts a non-standard pin configuration 220 (for example, a 200-pin configuration) to standard pin configuration 210 (for example a 168-pin configuration). The pin matching circuit 200 includes a first matching unit 202 for control signals and address signals, a second matching unit 204 for data input/output (DQ) signals, and a third matching unit 206 for power signals (Vcc/GND). In a preferred embodiment, the first matching unit 202 allows a one-to-one correspondence that uniquely assigns each control signal and address signal of the standard pin configuration 210 to each control signal and address signal of the non-standard pin configuration 220. The second matching unit 204 preferably allows a sequential and interleaving link that selectively assigns each data input/output signal of the standard pin configuration 210 to each data input/output signal of the non-standard pin configuration 220.

In an example embodiment for matching a 200-pin output to a 168-pin input, the control/address signals include WE (write enable), DQM (data input/output mask), CS (chip select), CLK (system clock), CKE (clock enable), RAS (row address strobe), CAS (column address strobe), SDA (serial data, I/O), SCL (serial clock), SA (address in EEPROM), WP (write protection), A0~A12 (address) and BA0~BA1 (bank select address). For example, an input pin No. 27 named WE might correspond to an output pin No. 148 named WE, and an input pin No. 42 named CLK0 might correspond to an output pin No. 151 named CLK0. On the other hand, DQ signal input pins named DQ0~DQ63 and CB0~CB7 (check bit) are linked to DQ signal output pins named DQ0~DQ71 in a sequential and interleaving order. For example, the DQ0~3, DQ4~7 and DQ8~11 input pins correspond to the DQ64~67, DQ60~63 and DQ48~51 output pins, respectively.

Figure 5:
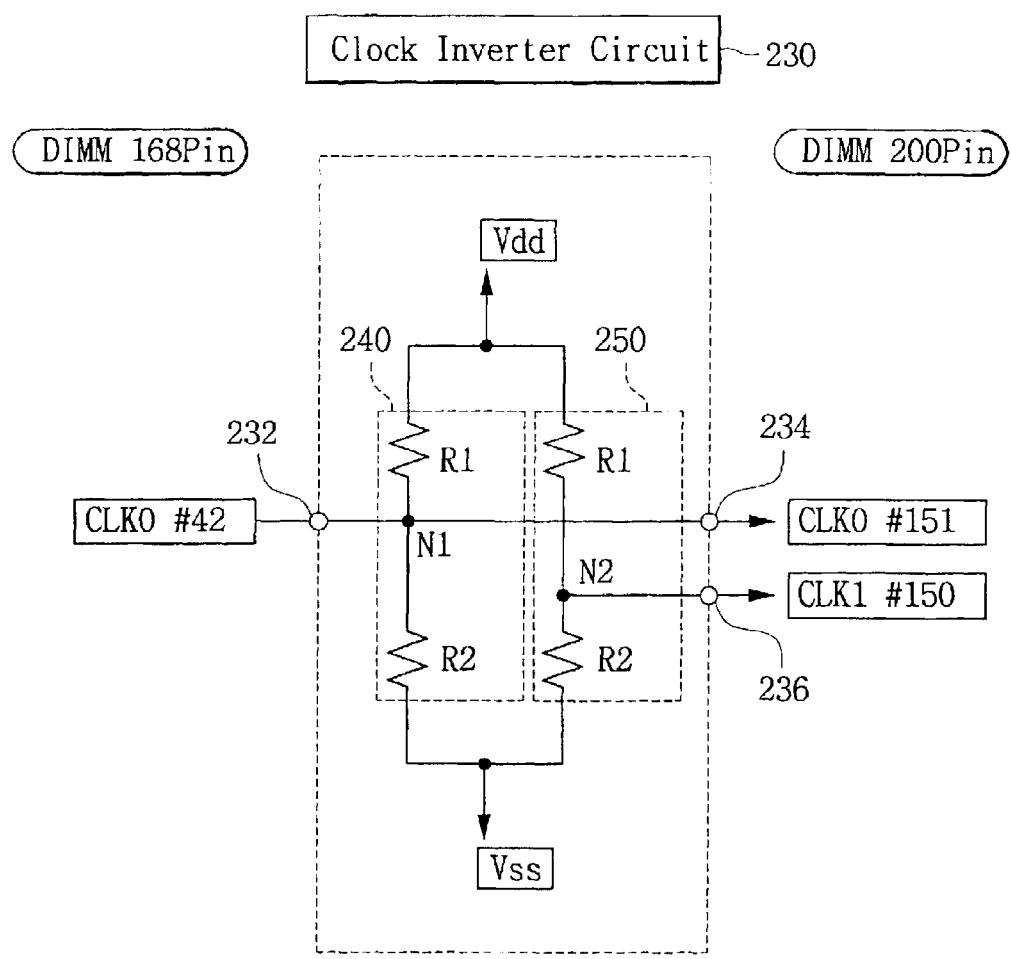
FIG. 5 is a block diagram showing an embodiment of a clock inverter circuit of an interface board in accordance with the present invention.
Figure 6:
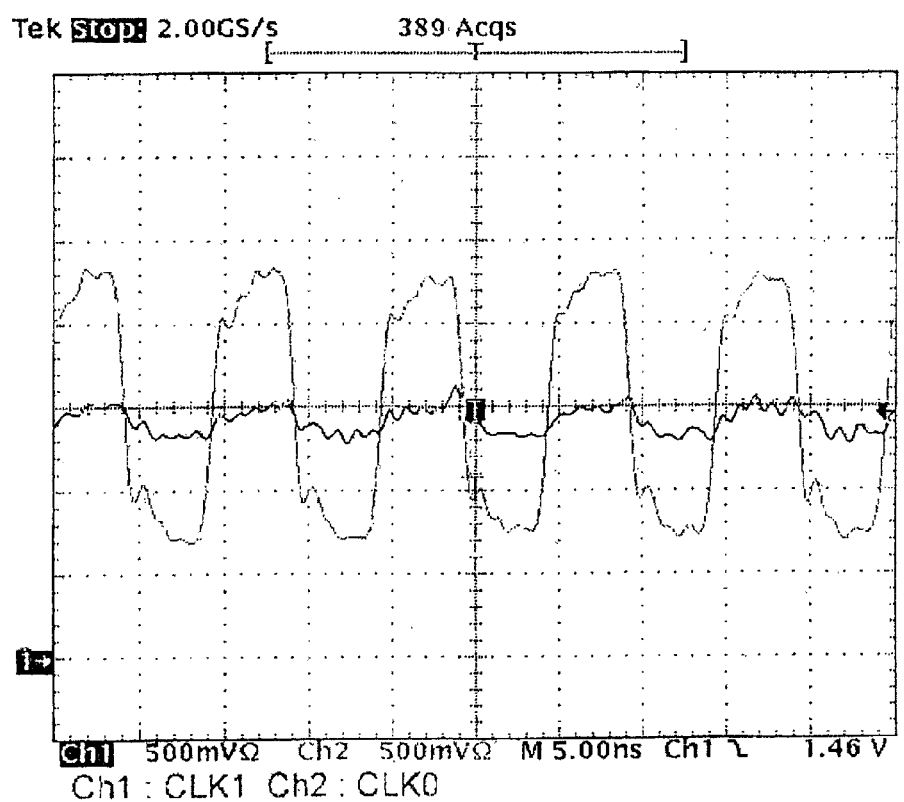
FIG. 6 is a waveform graph showing an output signal of an embodiment of a clock inverter circuit in accordance with the present invention.

An interface board according to the present invention may further include a clock inverter circuit. FIG. 5 is a block diagram showing an embodiment of a clock inverter circuit 230, and FIG. 6 is a graph showing signal waveforms of the clock inverter circuit. The clock inverter circuit 230, which is provided on the circuit layer of the interface board described above, includes an input terminal 232 connected to a CLK0 pin (No. 42 of a 168-pin DIMM), a first output terminal 234 connected to a CLK0 pin (No. 151 of a 200-pin DIMM), and a second output terminal 236 connected to a CLK1 pin (No. 150 of a 200-pin DIMM).

The clock inverter circuit 230 further includes two resistance circuits 240 and 250 connected in parallel between a positive power terminal Vdd and a ground terminal Vss. The first resistance circuit 240 has a first resistor R1 connected between the power terminal Vdd and a first node N1, and a second resistor R2 connected between the first node N1 and the ground terminal Vss. Similarly, the second resistance circuit 250 has a third resistor R1 that is identical to the first resistor and connected between the power terminal Vdd and a second node N2, and a fourth resistor R2 that is identical to the second resistor and connected between the second node N2 and the ground terminal Vss. Preferably, the first or third resistor R1 is much smaller in value than second or fourth resistor R2. For example, R1 can be one hundred ohms while R2 is ten kilo-ohms. The first node N1 is connected to both the input terminal 232 and the first output terminal 234, and the second node N2 is connected to the second output terminal 236.

The clock inverter circuit 230 of FIG. 5 permits tests for a PC100 200-pin device and a PC133 200-pin device. Here, PC100 and PC133 refer to 100MHz and 133MHz data processing speeds, respectively, between the CPU of the computer system (or the test substrate) and the memory module. Other processing speeds can also be accommodated. While the 200-pin PC100 module is constructed to use the system clock signal CLK0 only (in which case CLK1 is not connected (NC)), the 200-pin PC133 module utilizes both system clock signals CLK0 and CLK1. The clock inverter circuit 230 keeps CLK1 separate during a test of a 200-pin PC100 module, but simultaneously enables CLK0 and CLK1 during a test of a 200-pin PC133 module.

In a case where a power supply voltage of 3.3 V is applied to the clock inverter circuit 230, CLK0 of the 168-pin DIMM connected to the input terminal 232 can be set to a high level or a low level. When CLK0 is high, the first node N1 remains high, and therefore, the first output terminal 234 and CLK0 of the 200-pin DIMM remains high as well. When CLK0 of the 168-pin DIMM goes low, CLK0 of the 200-pin DIMM also drops to the low level because the value of R1 is much lower than R2.

Since the first and the second resistance circuits 240 and 250 have the power terminal Vdd in common, CLK1 of the 200-pin DIMM follows variations of in the level of CLK0 of the 168-pin DIMM. However, the variation in CLK1 of the 200-pin DIMM is much smaller than that of CLK0 of the 200-pin DIMM because electric charge supplied from the power terminal Vdd always runs in parallel with the first resistance circuit 240, and thus, electric charge flowing in the second resistance circuit 250 is limited depending on the voltage level of the first node N1. This is confirmed by the waveforms shown in FIG. 6.

Figure 7:
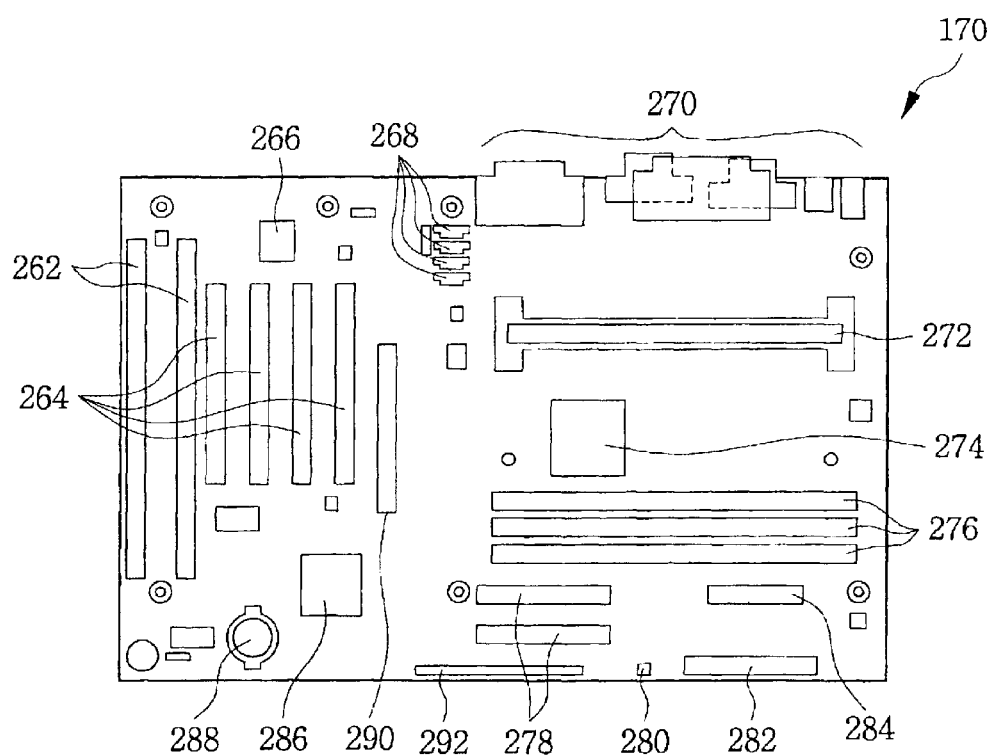
FIG. 7 is a plan view showing one exemplary embodiment of a test substrate used for the present invention.

FIG. 7 shows an embodiment of one exemplary test substrate used to provide an actual operation environment for the present invention. The test substrate 170 includes various types of components such as ISA connectors 262, PCI connectors 264, a PCI audio controller 266, several line connectors 268, back panel connectors 270, a slot connector 272, a PCI/AGP controller 274, DIMM sockets 276, IDE connectors 278, an LED connector 280, a diskette drive connector 282, a power supply connector 284, an IDE accelerator 286, a battery 288, an AGP connector 290 and front panel connectors 292. The components mounted on the test substrate 170 are not limited to those illustrated of FIG. 7, and a great variety of components may be employed for the test substrate 170 depending on the desired operating conditions for the semiconductor device to be tested.

Figure 8:
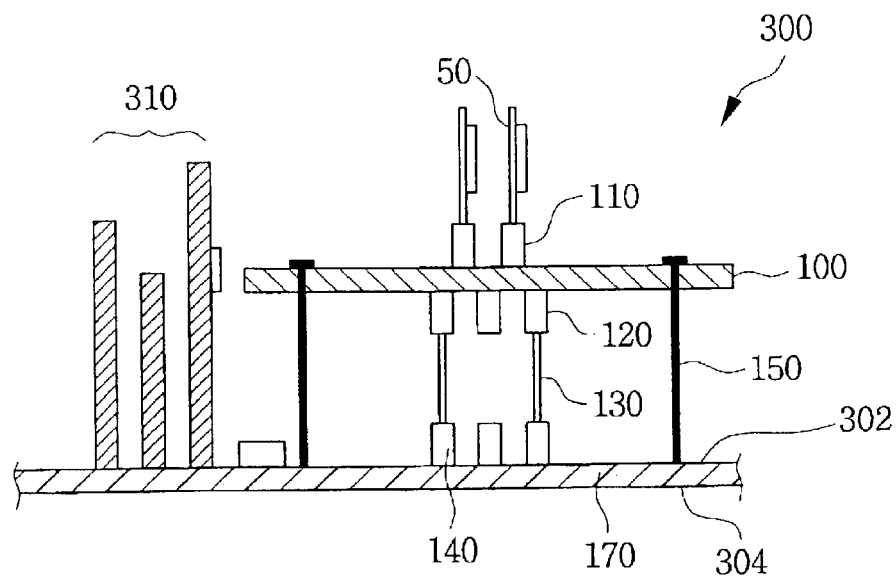
FIG. 8 is a cross-sectional view showing another embodiment of a testing system in accordance with the present invention.

Another embodiment of an actual testing system is shown in FIG. 8. Referring to FIG. 8, the actual testing system 300 has a standard test substrate 170 on which a plurality of components 310 are mounted. The components 310 provide actual test conditions to the non-standard memory device 50. The test substrate 170 has a top surface 302 and a bottom surface 304. The top surface 302 receives the interface board 100 as well as the components 310. A support 150 fixes the interface board 100, on which the memory device 50 is mounted, to the test substrate 170. An electrical connection between the memory device 50 and the test substrate 170 is made by the first and second sockets 110 and 120 of the interface board 100, the connection board 130, and the socket 140 of the test substrate 170.

Figure 9:
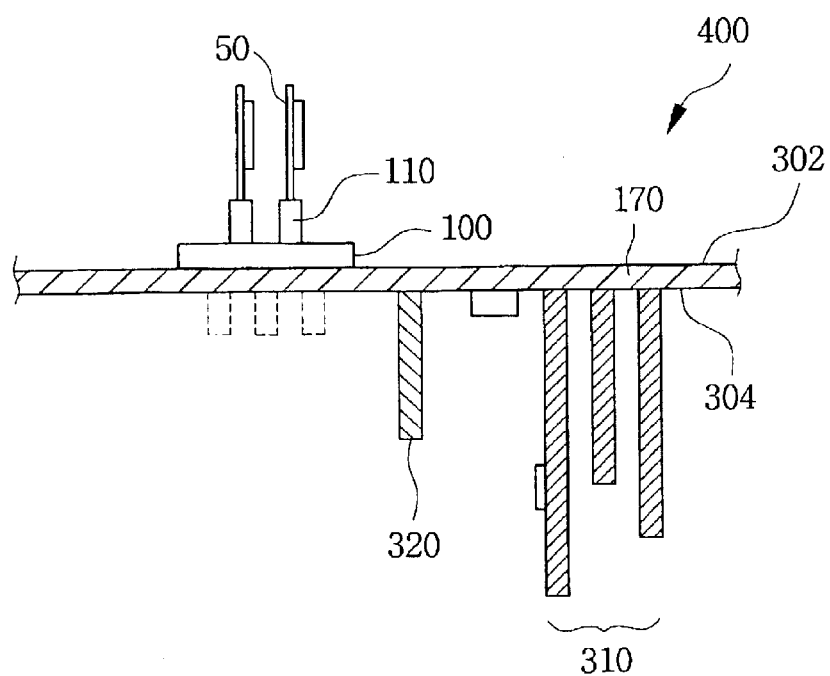
FIG. 9 illustrates another embodiment of an actual testing system according to the present invention.

FIG. 9 illustrates another embodiment of an actual testing system 400. As seen from FIG. 9, other types of components 310 and 320 are mounted on the bottom surface 304 of the test substrate 170, whereas the interface board 100 is directly mounted on the top surface 302. Therefore, such an arrangement provides enough space to allow easy mounting and removal of the interface board 100, simple exchange of the device under test, and testing of large numbers of devices.

The embodiments described herein can be modified in arrangement and detail without departing from the principles of the present invention. Accordingly, such changes and modifications are considered to fall within the scope of the following claims.

What is claimed is:

1. An interface board for testing a non-standard memory device under actual operating conditions comprising:
    a circuit board including a first surface, a second surface, and a circuit layer;
    a first socket formed on the first surface of the circuit board to receive the non-standard memory device and electrically connect the memory device and the circuit layer;
    a second socket formed on the second surface of the circuit board to electrically connect the circuit layer and a standard test substrate; and
    a pin matching circuit formed in the circuit layer to match a standard pin configuration of the standard test substrate with a non-standard pin configuration of the non-standard memory device.

2. The interface board of claim 1, further comprising:
    a clock inverter circuit formed in the circuit layer to sequentially or selectively enable two clock signals of the non-standard pin configuration in response to one clock signal of the standard pin configuration.

3. The interface board of claim 1, wherein the pin matching circuit includes a first matching unit for allowing a one-to-one correspondence that uniquely assigns each control signal and address signal of the standard pin configuration to each control signal and address signal of the non-standard pin configuration.

4. The interface board of claim 3, wherein the pin matching circuit further includes a second matching unit for allowing a sequential and interleaving link that selectively assigns each data input/output signal of the standard pin configuration to each data input/output signal of the non-standard pin configuration.

5. The interface board of claim 1, wherein the circuit layer has a power plane, a ground plane, and at least one signal plane that are electrically insulated from each other and result in a multi-layered structure.

6. The interface board of claim 1, wherein the first socket has a form adequate for a board-type product into which the non-standard memory device is assembled.

7. The interface board of claim 1, wherein the first socket includes a groove having contact pins for allowing a temporary contact with the non-standard memory device.

8. The interface board of claim 2, wherein the clock inverter circuit includes an input terminal connected to a clock signal of the standard pin configuration, first and second output terminals connected to first and second clock signals of the non-standard pin configuration, respectively, and first and second resistance circuits connected in parallel between a power terminal and a ground terminal.

9. The interface board of claim 8, wherein the first resistance circuit has a first resistor connected between the input terminal and the power terminal, and a second resistor connected between the input terminal and the ground terminal, wherein the second resistance circuit has a third resistor connected between the second output terminal and the power terminal, and a fourth resistor connected between the second output terminal and the ground terminal, and wherein the first output terminal is directly connected to the input terminal.

10. The interface board of claim 9, wherein the first resistor and the third resistor have the same value, wherein the second resistor and the fourth resistor have the same value, and wherein the first resistor is smaller in value than the second resistor.

11. The interface board of claim 1, wherein the non-standard memory device is a 200-pin memory module, and wherein the standard test substrate is a system motherboard for a 168-pin memory module.

12. The interface board of claim 2, wherein only one of the clock signals of the non-standard pin configuration is enabled alone when the non-standard memory device is a PC100 device, and wherein two of the clock signals of the non-standard pin configuration are enabled simultaneously when the non-standard memory device is a PC133 device.

13. A system for testing a non-standard memory device under actual operating conditions comprising:
a standard test substrate comprising a plurality of components for providing actual test conditions to the non-standard memory device; and
an interface board comprising:
a circuit board including a first surface, a second surface, and a circuit layer;
a first socket formed on the first surface of the circuit board to receive the non-standard memory device and electrically connect the memory device and the circuit layer;
a second socket formed on the second surface of the circuit board to electrically connect the circuit layer and the standard test substrate; and
a pin matching circuit formed in the circuit layer to match a standard pin configuration of the standard test substrate with a non-standard pin configuration of the non-standard memory device.

14. The system of claim 13, wherein the interface board further comprises a clock inverter circuit formed in the circuit layer to selectively or simultaneously enable two clock signals of the non-standard pin configuration in response to one clock signal of the standard pin configuration.

15. The system of claim 13, wherein the interface board is mounted on a surface of the standard test substrate where the plurality of components of the standard test substrate are formed.

16. The system of claim 13, wherein the interface board is mounted on a surface of the standard test substrate opposite to where the plurality of components of the standard test substrate are formed.

17. The system of claim 13, wherein the pin matching circuit includes a first matching unit for allowing a one-to-one correspondence that uniquely assigns each control signal and address signal of the standard pin configuration to each control signal and address signal of the non-standard pin configuration, and a second matching unit for allowing a sequential and interleaving link that selectively assigns each data input/output signal of the standard pin configuration to each data input/output signal of the non-standard pin configuration.

18. The system of claim 14, wherein the clock inverter circuit includes an input terminal connected to a clock signal of the standard pin configuration, first and second output terminals connected to first and second clock signals of the non-standard pin configuration, respectively, and first and second resistance circuits connected in parallel between a power terminal and a ground terminal.

19. The system of claim 18, wherein the first resistance circuit has a first resistor connected between the input terminal and the power terminal, and a second resistor connected between the input terminal and the ground terminal, wherein the second resistance circuit has a third resistor connected between the second output terminal and the power terminal, and a fourth resistor connected between the second output terminal and the ground terminal, wherein the first output terminal is directly connected to the input terminal, wherein the first resistor and the third resistor have the same value, wherein the second resistor and the fourth resistor have the same value, and wherein the first resistor is smaller in value than the second resistor.

20. The system of claim 13, wherein the non-standard memory device is a 200-pin memory module, and wherein the standard test substrate is a system motherboard for a 168-pin memory module.

21. A system for testing a non-standard memory device under actual operating conditions comprising:
an interface board having a first surface, a second surface, and a pin matching circuit; and
a socket on the first surface to couple the non-standard memory device to the pin matching circuit;
wherein the second surface is constructed and arranged to couple the pin matching circuit to a standard pin configuration.

22. The system according to claim 21 further comprising a test substrate directly mounted to the second surface of the interface board.

23. The system according to claim 21 wherein the socket is a first socket, and further comprising a second socket on the second surface of the interface board to couple the pin matching circuit to a test substrate.

24. The system according to claim 23 further comprising a test substrate coupled to the second socket.

25. The system according to claim 23 further comprising a connection board coupled between the second socket and the test substrate.

26. The system according to claim 25 wherein the test substrate comprises a third socket constructed and arranged to receive the connection board.

27. The system according to claim 24 further comprising a support constructed and arranged to affix the interface board to the test substrate.

28. The system according to claim 21 wherein the interface board further comprises a clock inverter circuit to drive two clock signals of the non-standard pin configuration in response to one clock signal of the standard pin configuration.

29. The system according to claim 21 wherein the pin matching circuit comprises a first matching unit for allowing a one-to-one correspondence between signals of the standard pin configuration and non-standard pin configurations.

30. The system according to claim 29 wherein the pin matching circuit further comprises a second matching unit to selectively assign signals of the standard pin configuration to signals of the non-standard pin configuration.

31. A method for testing a memory device having a non-standard pin configuration under actual operating conditions comprising:
coupling the memory device to an interface board that is constructed and arranged to adapt the non-standard pin configuration of the memory device to a standard pin configuration on a test substrate; and
operating the test substrate.

32. The method according to claim 31 wherein coupling the memory device to the interface board comprises coupling the memory device to a socket on a first surface of the interface board.

33. The method according to claim 32 wherein the interface board comprises:
a pin matching circuit coupled to the socket; and
a second surface that is constructed and arranged to couple the pin matching circuit to the standard pin configuration on the test substrate.

34. The method according to claim 31 wherein the interface board is coupled to the test substrate by a connection board.

35. The method according to claim 31 wherein the interface board is directly mounted to the test substrate.

* * * * *